(12) United States Patent
Qiu et al.

(10) Patent No.: US 11,675,033 B2
(45) Date of Patent: Jun. 13, 2023

(54) DAMPING MECHANISM, RF COIL DEVICE AND MRI APPARATUS

(71) Applicant: KONINKLIJKE PHILIPS N.V., Eindhoven (NL)

(72) Inventors: Deyi Qiu, Suzhou (CN); Junbo Zhang, Suzhou (CN)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/761,214

(22) PCT Filed: Sep. 11, 2020

(86) PCT No.: PCT/EP2020/075423
§ 371 (c)(1),
(2) Date: Mar. 17, 2022

(87) PCT Pub. No.: WO2021/052874
PCT Pub. Date: Mar. 25, 2021

(65) Prior Publication Data
US 2022/0373623 A1 Nov. 24, 2022

(30) Foreign Application Priority Data

Sep. 20, 2019 (WO) ................ PCT/CN2019/106969
Dec. 2, 2019 (EP) ..................................... 19212876

(51) Int. Cl.
*G01R 33/34* (2006.01)
(52) U.S. Cl.
CPC . *G01R 33/34007* (2013.01); *G01R 33/34084* (2013.01)
(58) Field of Classification Search
CPC ........ G01R 33/34007; G01R 33/34084; E05D 11/105
See application file for complete search history.

(56) References Cited

U.S. PATENT DOCUMENTS 3,416,119 A * 12/1968 Benthuysen ........... H01C 10/32
74/435
5,221,902 A 6/1993 Jones et al.
(Continued)

FOREIGN PATENT DOCUMENTS

CN 106842086 A 6/2017
EP 0255879 A2 2/1988
(Continued)

OTHER PUBLICATIONS

International Search Report and Written Opinion from PCT/EP2020/075423 dated Nov. 23, 2020.

*Primary Examiner* — G. M. A Hyder (57) ABSTRACT

The present invention provides a damping mechanism comprising a first member comprising a base section, a resilient damping section and an enclosed chamber defined by the base section and an inner surface of the resilient damping section. The resilient damping section is centered about a rotation axis and the enclosed chamber is provided radially inward of the resilient damping section and configured to accommodate a deformation of the resilient damping section. A second member is attached pivotably to the base section of the first member to rotate around the rotation axis relative to the base section. A damping protrusion extends from the second member toward the resilient damping section. The resilient damping section comprises an outer surface facing away from the enclosed chamber which is configured to be engaged with the damping protrusion to produce the deformation of the resilient damping section and provide a damping to the rotation of the second member relative to the base section. According to the present invention, the damping mechanism is simple in structure and easy to manufacture and assemble.

14 Claims, 9 Drawing Sheets

(56) References Cited

U.S. PATENT DOCUMENTS

| | | | | |
|---|---|---|---|---|
| 7,287,968 | B2* | 10/2007 | Haser | F04B 43/1284 |
| | | | | 417/477.9 |
| 8,234,817 | B2* | 8/2012 | Neundorf | E05F 15/611 |
| | | | | 49/28 |
| 2006/0241393 | A1 | 10/2006 | Liu et al. | |
| 2007/0152667 | A1 | 7/2007 | Schubert et al. | |
| 2011/0260728 | A1 | 10/2011 | Biber et al. | |
| 2012/0265052 | A1 | 10/2012 | Rohr et al. | |
| 2012/0286784 | A1 | 11/2012 | Driemel | |
| 2013/0237328 | A1 | 9/2013 | Billings et al. | |

FOREIGN PATENT DOCUMENTS

| | | |
|---|---|---|
| EP | 0450626 A1 | 10/1991 |
| GB | 741593 A | 12/1955 |
| JP | 0674277 A | 3/1994 |
| JP | 0871053 A | 3/1996 |

\* cited by examiner

DAMPING MECHANISM, RF COIL DEVICE AND MRI APPARATUS

FIELD OF THE INVENTION

The invention relates to a damping mechanism. More particularly, the present invention relates to a RF (radio frequency) coil device having a damping mechanism which is adapted to be used with a magnetic resonance imaging (MRI) apparatus. The present invention also relates to a MRI apparatus comprising the RF coil device.

RF coil devices are used in a MRI apparatus. Some coil devices, for example those used for MRI scans on area of the patient such as the head, the shoulder or the ankle, generally comprise a base assembly and a top coil assembly attached pivotably to the base assembly. To conduct the scan, the top coil assembly is firstly flipped over, the area of the patient to be scanned such as the head, the shoulder or the ankle is supported on the base assembly and the top coil assembly is then flipped back to the area of the patient to be scanned. To prevent the top coil assembly from incidentally falling on the area of the patient to be scanned, a damping mechanism is provided between the top coil assembly and the base assembly. However, the existing damping mechanism for MR application is complicated in structure and difficult to manufacture and assemble.

CN106842086 discloses a radio frequency (RF) coil assembly for magnetic resonance imaging whose upper coil can be flipped relative to the bottom coil. The RF coil assembly provides a buffer element 311 and a protruding post 309 which interact with each other to serve as a braking mechanism to stop the rotation at an angle when the forces applied to the buffer element 311 are balanced with each other. US20130237328A1 discloses a detent device with co-axially arranged first hub and second hub to establish a user experience indicating a home, closed or operating position by providing a force versus angle relationship. EP0255879A2 relates to a door hinge for a vehicle door. The hinge includes co-axially arranged hingle pin body 3 and centeral eye 7. The steel needles 14 equipped in the pin 3 serves as locking elements and cooperate with three profile blades 15 supported on the inner furface of the centeral eye 17.

Thus, there is a need to make improvements on the existing damping mechanism.

SUMMARY OF THE INVENTION

The present invention seeks to provide a damping mechanism which is simple in structure and easy to manufacture and assemble.

According to one aspect of the present invention, it is to provide a damping mechanism, comprising:

a first member comprising a base section, a resilient damping section and an enclosed chamber defined by the base section and an inner surface of the resilient damping section, wherein the resilient damping section is centered about a rotation axis and the enclosed chamber is provided radially inward of the resilient damping section and configured to accommodate a deformation of the resilient damping section;

a second member attached pivotably to the base section of the first member to rotate around the rotation axis relative to the base section; and a damping protrusion extending from the second member toward the resilient damping section;

wherein the resilient damping section comprises an outer surface facing away from the enclosed chamber which is configured to be engaged with the damping protrusion to produce the deformation of the resilient damping section and provide a damping to the rotation of the second member relative to the base section.

According to this present invention, by engaging the damping protrusion with the outer surface of the resilient damping section, it is to provide a damping to the rotation of the second member relative to the base section in an easy and simple way. Furthermore, the damping mechanism according to the present invention requires very little space, which makes it an ideal solution for a compact device with damping capability, e.g., RF coils, rotatable mirror, patient support used for various medical devices.

In one embodiment, the resilient damping section is configured as a substantially arc-shaped rack having a plurality of outer teeth and the outer surface comprises a toothed surface defined by the plurality of outer teeth. In this way, the rotation of second member relative to the first member can be stopped reliably at a plurality of desired positions.

In one embodiment, the damping mechanism is made of plastic material and the resilient damping section is sized to produce the deformation during the rotation. In this way, the damping mechanism can be used in MRI environment and owing to the size configuration, the produced deformation of the resilient damping section allows the rotation movement to continue without execution of significantly increased external force.

In one embodiment, a predetermined portion of the resilient damping section is provided with the outer teeth to provide the damping to a predetermined range of rotation of the second member. In this way, a damping to the rotation of the second member relative to the base section is provided in a predetermined range of traveling of the second member.

In one embodiment, each of the outer teeth comprises a first side surface and a second side surface, and one of the first side surface and the second side surface facing a central portion of the substantially arc-shaped rack is inclined at a larger angle relative to a root surface of the substantially arc-shaped rack than the other of the first side surface and the second side surface facing away from the central portion of the substantially arc-shaped rack. In this way, the second member may move easily toward a central portion of the resilient damping section from an end portion of the resilient damping section and meanwhile the second member is prevented from falling incidentally down.

In one embodiment, the outer surface of the resilient damping section may have a gradually increasing radius at least in a portion adjacent to an end portion of the resilient damping section so that a gradually increasing damping force is generated when the second member pivots from a central portion of the resilient damping section toward the end portion of the resilient damping section. In this configuration, it is unnecessary to form the outer teeth on the outer surface of the resilient damping section.

In one embodiment, the resilient damping section may be elastically deformed to move toward the enclosed chamber when the second member rotates relative to the base section. In one embodiment, the resilient damping section may be restored from the deformed state to stop the rotation of the second member relative to the base section. By means of the resilient damping section that can be elastically deformed, a damping mechanism having a simple structure can be provided.

In one embodiment, the damping protrusion may extend from the second member in a direction substantially parallel to the rotation axis. In this way, it is easy to manufacture the damping mechanism.

In one embodiment, the resilient damping section may be integral with the base section. In this way, a damping mechanism having a simple structure is provided.

In one embodiment, an outer cover may be disposed radially outward of the resilient damping section and separate radially from the resilient damping section. In this way, further protection can be provided to the resilient damping section.

In one embodiment, the damping mechanism comprises two first members and two damping protrusion each for engaging with the outer surface of the resilient damping section of a respective one of the two first members.

According to other aspect of the present invention, it is to provide a RF coil device comprising:

a base assembly; and a top coil assembly which is attached pivotably to the base assembly via a damping mechanism as described above, wherein the first member is supported on the base assembly and the second member is connected to top coil assembly.

In one embodiment, the damping mechanism is made of plastic material. In this way, it is possible to provide a RF coil device which is more friendly to a MRI apparatus.

According to further aspect of the present invention, it is to provide a method for a RF coil assembly, the method comprising:

rotating a top coil assembly relative to a base assembly around a rotation axis;

engaging a damping protrusion with an outer surface of a resilient damping section of the base assembly during a rotation movement of the damping protrusion relative to the base assembly, wherein the outer surface of the resilient damping section is centered about and faces away from the rotation axis, and the damping protrusion is connected to or an integral part of the top coil assembly for the rotation therewith;

deforming the resilient damping section to move radially inward as a result of the engagement between the damping protrusion and the resilient damping section during the rotation movement;

accommodating the deformation of the resilient damping section by an enclosed chamber partially defined by an inner surface of resilient damping section and provided inward of the resilient damping section; and damping the rotation of the top coil assembly by the deformation of the resilient damping section.

According to other aspect of the present invention, it is to a MRI apparatus comprising a RF coil device as described above.

These and other objects, features and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION OF THE EXEMPLARY EMBODIMENTS

Figure 1:
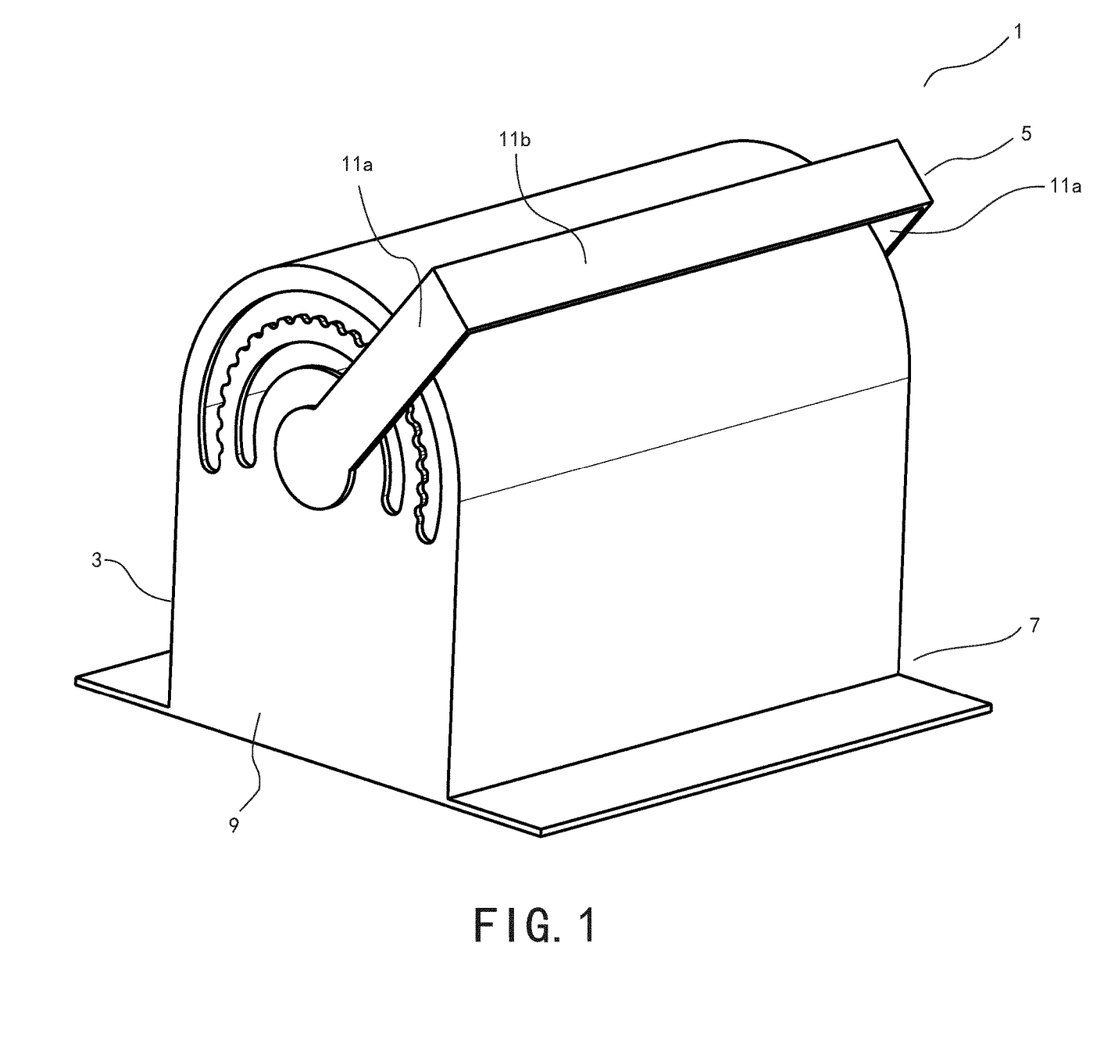
FIG. 1 is a schematic perspective view showing a damping mechanism according to an embodiment of the present invention.
Figure 2:
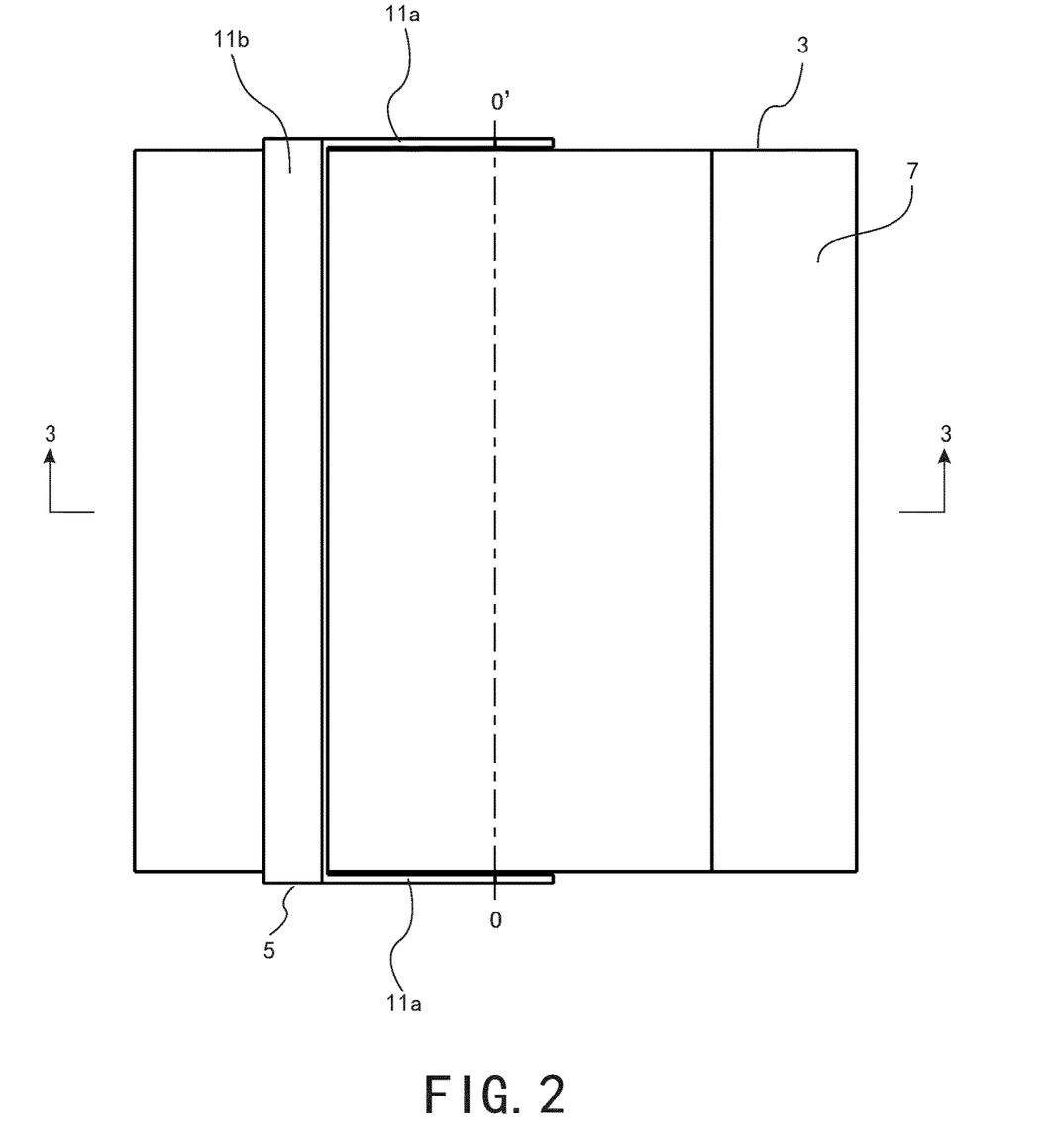
FIG. 2 is a top view of the damping mechanism as shown in FIG. 1.
Figure 3:
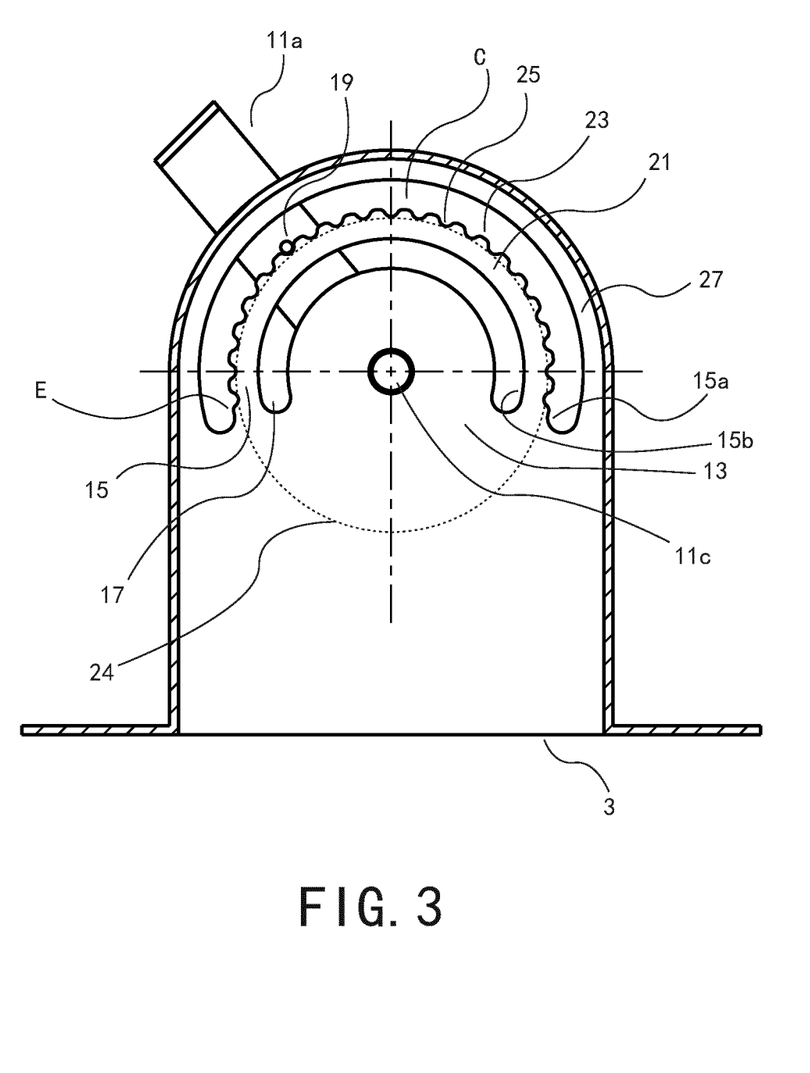
FIG. 3 is a sectional view taken along a line 3-3 of FIG. 2.

FIG. 1 is a schematic perspective view showing a damping mechanism according to an embodiment of the present invention. FIG. 2 is a top view of the damping mechanism as shown in FIG. 1. FIG. 3 is a sectional view taken along a line 3-3 of FIG. 2. As shown in FIGS. 1-3, a damping mechanism 1 according to one embodiment of the present invention comprises a first member 3 and a second member 5 attached pivotably to the first member 3. The pivotable connection allows the second member 5 to rotate relative to the first member 3. In the illustrated embodiment, the first member 3 is shown as a base box 7, which comprises at least one pair of opposite sidewalls 9 in a flat plate shape and spaced apart from each other, and the second member 5 is shown as an essentially U-shaped handle. The U-shaped second member 5 comprises two legs 11a which extend parallel or essentially parallel to planes of the flat plate-shaped sidewalls 9 respectively and are connected to one another via a connecting section 11b of the U-shaped second member 5. Legs of the U-shaped second member 5 are attached pivotably to the opposite sidewalls 9 in any known way.

It should be understood that FIG. 1 provides an exemplary non-limiting embodiment of the first member 3 and the second member 5. In some embodiments, the first member 5 and the second member 5 are formed into different shapes as long as the first member 3 serves as a mounting frame and the second member 5 is pivotably attached to the first member 3 to pivot about a rotation axis. For example, the first member 3 can also be in a flat plate shape and the second member 5 is a straight rod pivotally attached to the flat plate shaped first member 3. Of course, the first member 3 may be in a block shape, in a cylindrical shape or in any other suitable shape.

With reference to the embodiment in FIG. 2 and FIG. 3, the first member 3 comprises a base section 13, a resilient damping section 15 and a space 17 between the base section 13 and the resilient damping section 15. As shown in FIG. 3, the space 17 is enclosed by an inner surface 15b of the resilient damping section and the based section. The base section 13 serves as a mounting frame to which one leg 11a of the second member 5 is pivotably attached by means of a stud 11c. The pivotable connection allows the second member 5 to rotate relative to the first member 3 about a rotation axis OO' relative to the base section 13 as illustrated in FIG. 2. A damping protrusion 19 is provided on a surface of the leg 11a which extends radially outwardly from the rotation axis and faces the resilient damping section 15. The resilient damping section 15 has an outer surface 15a facing away from the rotation axis OO' and the inner surface 15b facing the rotation axis OO'. The damping protrusion 19 can engage with the outer surface 15a of the resilient damping section 15, and the engagement between the damping protrusion 19 and the outer surface 15a provides a damping to the rotation movement of the second member 5 relative to the base section 13.

More specifically, in one embodiment, the damping protrusion 19 is rigidly connected to the second member 5 and the rigid connection makes the damping protrusion 19 and the second member 5 integral with each other. Alternatively, the damping protrusion 19 is an integral part of the second member 5 itself. As such, the damping protrusion 19 itself rotates about the rotation axis OO' due to the rigid connection with the second member 5 or as an integral part of the second member 5. As the damping protrusion 19 further engages with the outer surface 15a of the resilient damping section 15, the engagement damps the rotation movement of the damping protrusion 19 and in turn damps the rotation movement of the second member 5. In one embodiment, the damping protrusion 19 extends parallel to the rotation axis OO'. It is conceived that the damping protrusion 19 extends slightly inclined to the rotation axis OO' as along as the inclination can still provide a secure engagement between the damp protrusion 19 and the outer surface 15a of the resilient damp section 15.

In an embodiment of the present invention, the resilient damping section 15 receives the damping protrusion 19 at a plurality of different positions on the outer surface 15a of the resilient damping section 15. Specifically, as illustrated in FIG. 3, the resilient damping section 15 is configured as a substantially arc-shaped rack 21 having a plurality of outer teeth 23. In this case, the outer surface 15a of the resilient damping section 15 is a toothed surface defined by the plurality of outer teeth 23. The resilient damping section 15 is centred about the rotation axis OO'. In the embodiment, the resilient damping section 15 is formed by a material which can deform elastically. Although the resilient damping section 15 may be formed separately from the base section 13 and then attached to the base section 13, it is conceived that the resilient damping section 15 is integral with the base section 13.

The enclosed chamber 17, e.g., a slot, is formed radially inward of the resilient damping section 15 and preferably in a substantially arc-shaped shape. The enclosed chamber 17 is sized to be large enough to accommodate the elastic deformation of the resilient damping section 15 when the second member 5 rotates around a rotation axis OO' relative to the base section 13. Specifically, when the second member 5 is pivoted relative to the base section 13, the second member 5 presses the outer tooth 23 on the resilient damping section 15 radially inwardly so that the resilient damping section 15 deforms elastically toward the enclosed chamber 17 under an external force applied to the second member 5. As a result, the resilient damping section 15 moves toward the enclosed chamber 17 so that the damping protrusion 19 on the second member 5 moves out of one tooth space 25 and into a next tooth space. In the meanwhile, the external force applied to the second member 5 is relieved and the resilient damping section 15 returns to an original (undeformed) state under an anti-force provided by the elastic deformation of the resilient damping section 15 itself. This process is repeated until the second member 5 is pivoted to a desired position at which the damping protrusion 19 on the second member 5 is received in one new tooth space to stop the second member 5 at this position. In the embodiment, the term "tooth space" means a concave space between two adjacent outer teeth on the second member 5 formed as the substantially arc-shaped rack. When the damping protrusion 19 is in a cylinder shape, the tooth spaces 21 may be in a semicircle shape and each tooth may have a symmetrical shape. Further, an outer cover 27 may be disposed radially outwardly of the resilient damping section 15 and separate radially from the resilient damping section 15 to protect the damping mechanism and improve the safety.

Further, the damping protrusion 19 also may have a semicircular, triangular, square cross section or the like. The damping protrusion 19 may be formed separately from the second member 5 or integrally with the second member 5. In the embodiment of FIG. 3, the base section 13 and the resilient damping section 15 are disposed in the same plane of the sidewalls. While, it is conceived that both the base section 13 and the resilient damping section 15 are not necessarily in the wall from, and that the resilient damping section 15 is not necessarily disposed in the same plane of the base section 13. For example, the base section 13 can be formed in any shape for pivotable attachment of the second member. The resilient damping section 15 can be attached to or integral with the base section 13 and disposed in a plane substantially perpendicular to the rotation axis OO'. Furthermore, the size of the resilient damping section 15 is configured to achieve the desired deformation and damping. For example, the width of the resilient damping section 15 along the rotation axis OO', i.e. the thickness of the resilient damping section 15, shall be thin enough to facilitate the deformation of the resilient damping section 15 and thick enough to provide sufficient damping force for the rotation.

Alternatively, a frictional force of a frictional engagement between the damping protrusion 19 and the outer surface 15a of the second member 5 damps the rotation movement. In a free state when no external force is applied to the second member 5, the frictional engagement between the damping protrusion 19 and the outer surface 15a of the resilient damping section 15 allows the second member 5 to stop at any position. In an operation state when an external force is applied to the second member 5 to start the rotation movement, the damping protrusion 15 presses the resilient damping section 15 radially inwardly so that the resilient damping section 15 deforms elastically toward the enclosed chamber. The deformation enables the damping protrusion 19 to move on the outer surface 15a of the resilient damping section 15 without execution of significantly increased external force. When the external force is relieved, the resilient damping section 15 restores from the deformed state to its free state and the frictional engagement between the damping protrusion 19 and the outer surface 15a makes the second member 5 stop at a predetermined position.

Figure 4:
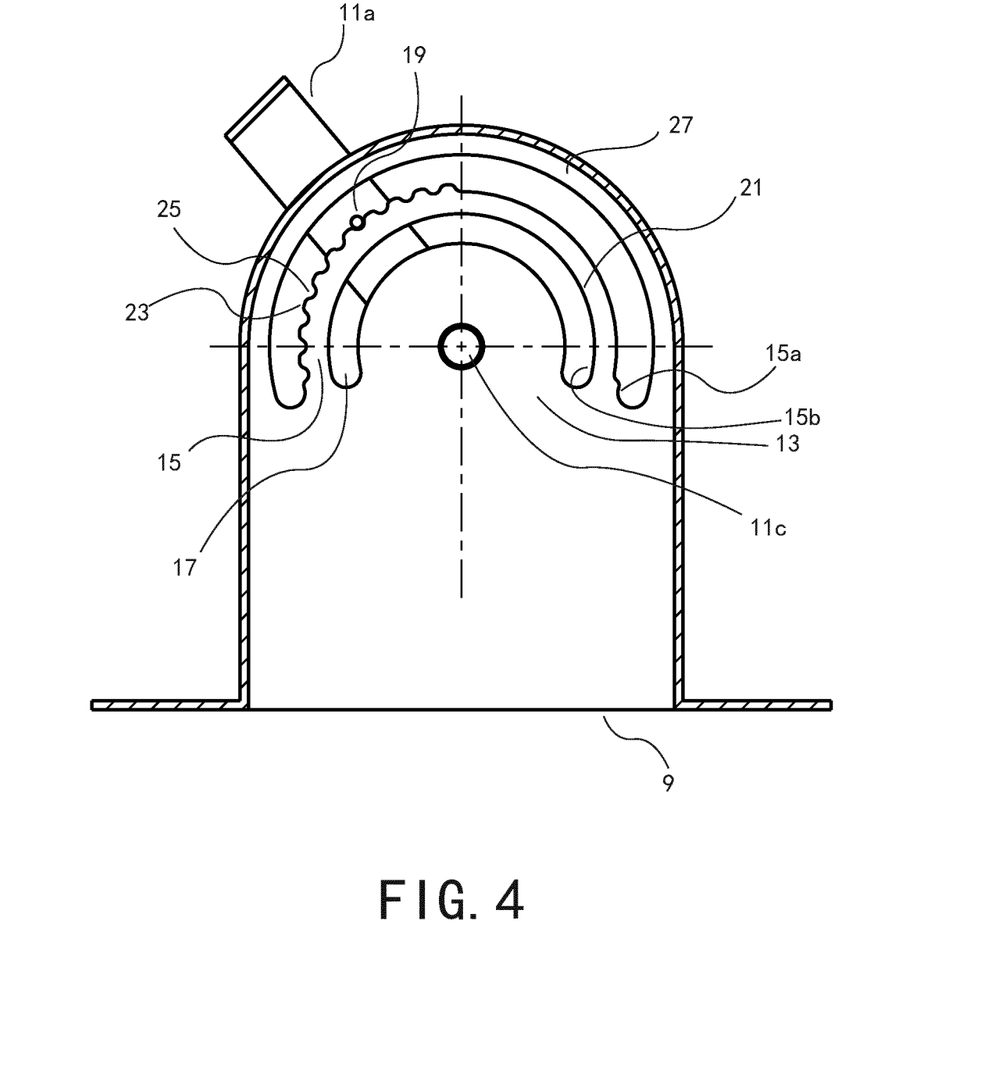
FIG. 4 is a sectional view similar to FIG. 3.

FIG. 4 is a sectional view similar to FIG. 3. In the embodiment as shown in FIG. 3, the entire outer surface 15a of the resilient damping section 15 is provided with the outer teeth 23 so that outer surface 15a can engage with the damping protrusion 19 in a travelling range of 180° of the second member 5. Different from the embodiment as shown in FIG. 3, in the embodiment as shown in FIG. 4, a portion of the resilient damping section 15 is provided with the outer teeth 23 so that the outer surface 15a can engage with the damping protrusion 19 in a travelling range of first 90° of the second member 5 and the outer surface 15a does not engage with the damping protrusion 19 in a travelling range of second 90° of the second member 5. As a result, a damping force is generated only in the travelling range of first 90° of the second member 5. It should be understood that the outer teeth 23 may be formed on the outer surface 15a of the resilient damping section 15 in any travelling range of the second member 5, such as 60° or 90°. The outer teeth 23 may be formed on the middle portion of the resilient damping section 15.

Figure 5:
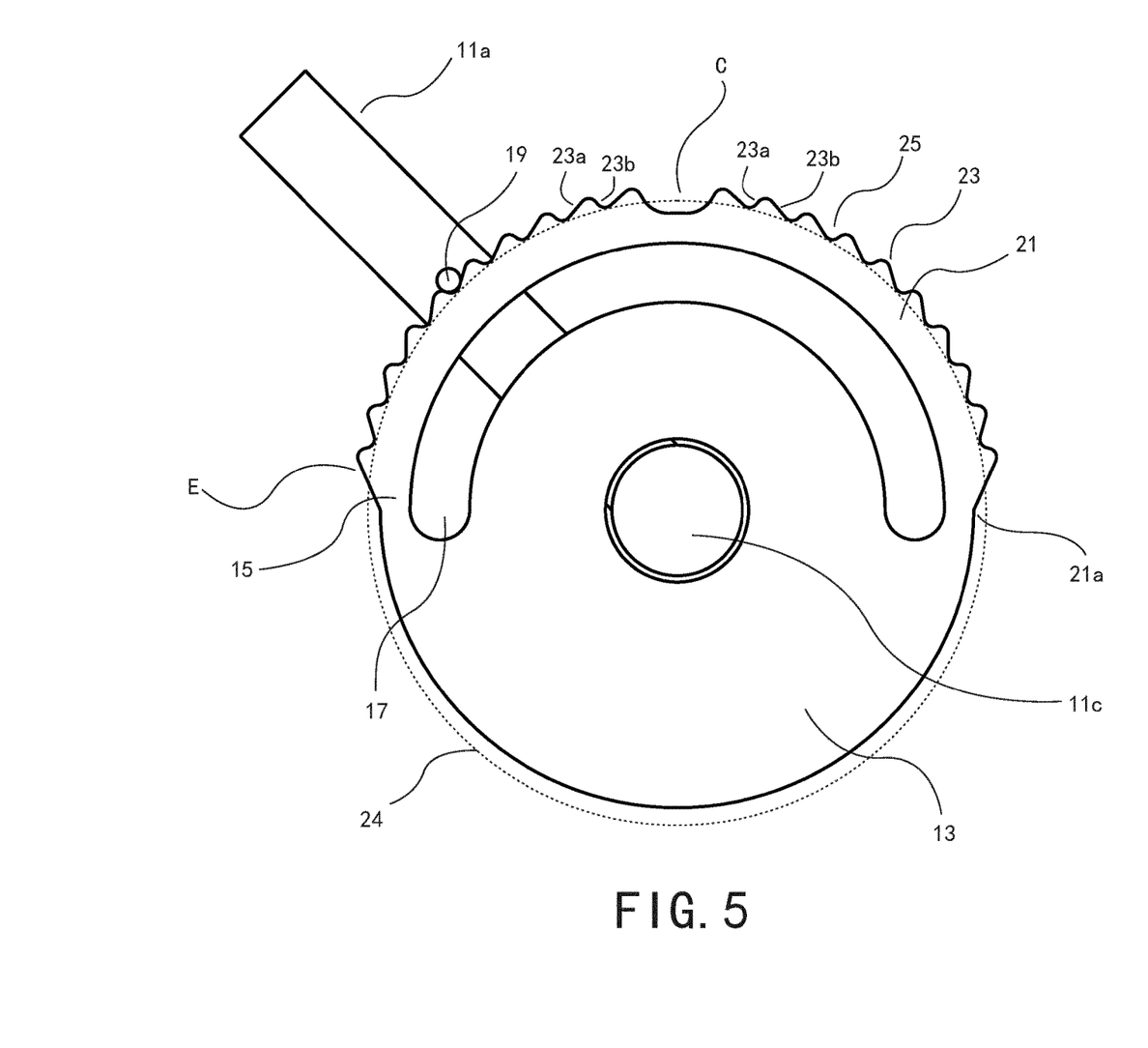
FIG. 5 is a sectional view similar to FIG. 3.

FIG. 5 is a sectional view similar to FIG. 3. Different from the embodiment of FIG. 3 in which each of the outer teeth 23 on the resilient damping section 15 is configured symmetrically, the outer teeth 23 on the resilient damping section 15 in the embodiment as shown in FIG. 5, each is configured asymmetrically. Specifically, each of the outer teeth 23 on the resilient damping section 15 comprises a first side surface 23a and a second side surface 23b which may engage the damping protrusion 19 when the damping protrusion 19 is received in the tooth space. The first side surface 23a and the second side surface 23b are inclined relative to a root surface 24 of the resilient damping section 15. In one embodiment, one of the first side surface 23a and the second side surface 23b facing a central portion C of the resilient damp section 15 is inclined at a larger angle relative to the root surface 24 than the other of the first side surface 23a and the second side surface 23b facing away from the central portion C of the resilient damp section 15. Specifically, for one tooth 23 in the right of the central portion C of the resilient damping section 15 as shown in FIG. 5, the first side surface 23a is inclined at a larger angle relative to the root surface 24 than the second side surface 23b; for one tooth 23 in the left of the central portion C of the resilient damping section 15 as shown in FIG. 5, the second side surface 23b is inclined at a larger angle relative to the root surface 24 than the first side surface 23a. As a result, the second member 5 may move easily toward the central portion C from an end portion E of the resilient damping section 15 while it prevents the second member 5 from falling incidentally down. Further, the shape of the base section 13 shown in FIG. 5 is different from that shown in FIG. 3. It should be understood that the base section 13 can be shaped in any suitable form. Herein, the end portion E of the resilient damping section 15 means an end portion of the resilient damping section 15 attached to the base section 13, and the central portion C of the resilient damping section 15 means a portion of the resilient damping section 15 centred substantially between the two end portions E of the resilient damping section 15.

Although in the illustrated embodiment the damping protrusion 19 on the second member 5 is received in the tooth space defined by the outer teeth distributed evenly on the outer surface 15a of the resilient damping section 15, the damping protrusion 19 can be received in notches in other form and the notches may be distributed unevenly on the outer surface 15a.

Further, although in the illustrated embodiment a plurality of outer teeth 23 are formed on the outer surface 15a of the resilient damping section 15, it is feasible that there is no outer tooth on the outer surface 15a of the resilient damping section 15. In this case, the radius of the outer surface 15a of the resilient damping section 15 may gradually increase from the central portion C to the end portion E of the resilient damping section 15. As a result, a gradually increasing damping force is generated when the second member 5 pivots from the central portion C of the resilient damping section 15 toward an end portion E of the resilient damping section 15. Of course, the outer surface 15a of the resilient damping section 15 may have a gradually increasing radius only in a portion adjacent to the end portion E of the resilient damping section 15.

Figure 6:
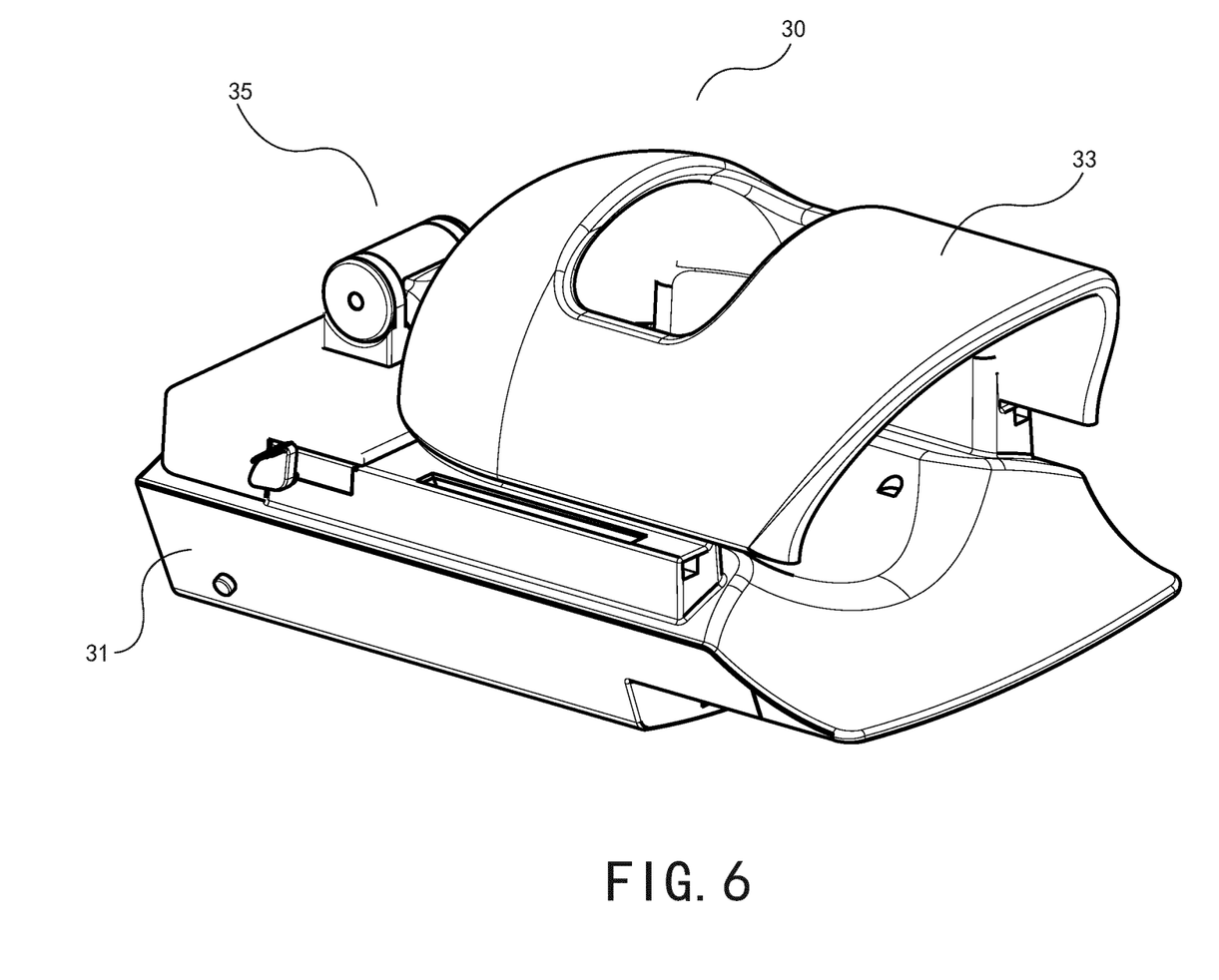
FIG. 6 is a schematic perspective view showing a RF coil device according to an embodiment of the present invention, in which the top coil assembly is pivoted onto the base assembly.
Figure 7:
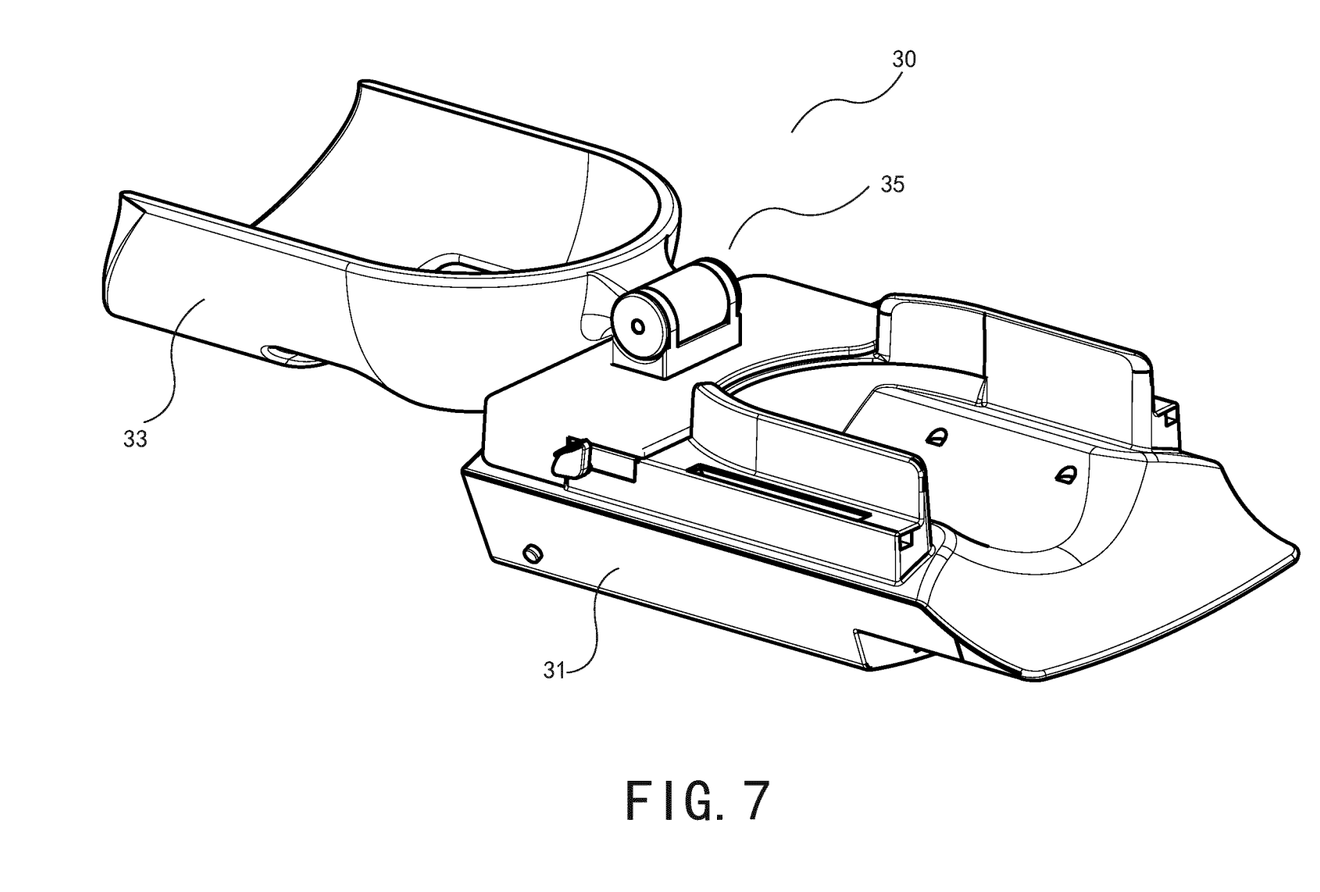
FIG. 7 is a schematic perspective view showing the RF coil device as shown in FIG. 6, in which the top coil assembly is flipped over from the base assembly.

FIG. 6 is a schematic perspective view showing a RF coil device according to an embodiment of the present invention, in which the top coil assembly is pivoted onto the base assembly. FIG. 7 is a schematic perspective view showing the RF coil device as shown in FIG. 6, in which the top coil assembly is flipped over from the base assembly. As shown in FIGS. 6 and 7, a RF coil device 30 according to the present invention comprises a base assembly 31 and a top coil assembly 33 which is attached pivotably to the base assembly 31 via a damping mechanism 35. The RF coil device 30 may be used for MRI scans on area of the patient such as the head, the shoulder or the ankle. To conduct the scan, the top coil assembly 33 is firstly flipped over as shown in FIG. 7, the area of the patient to be scanned such as the head, the shoulder or the ankle is supported on the base assembly 31 and the top coil assembly 33 is then flipped back to the area (not shown) of the patient to be scanned as shown in FIG. 6.

Figure 8:
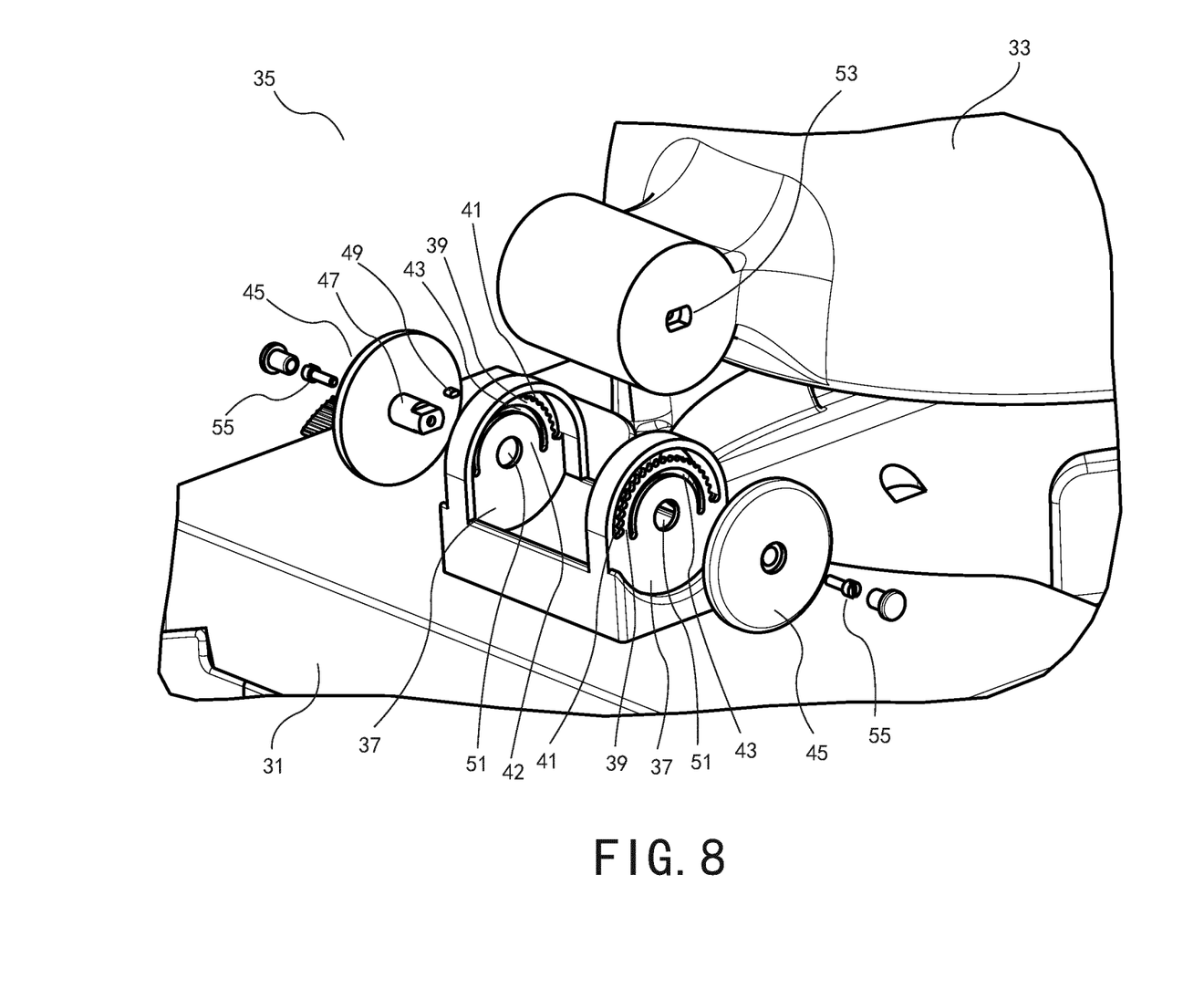
FIG. 8 is a partially exploded perspective view of a part of the RF coil device as shown in FIG. 6.

FIG. 8 is a partially exploded perspective view of a part of the RF coil device as shown in FIG. 6. As shown in FIG. 8, the damping mechanism 35 comprises a pair of opposite walls 37 provided on the base assembly 31. A substantially arc-shaped rack 39 having outer teeth 41 formed on its radial outer surface is provided in the wall 37 and a slot 43 is formed radially inward of the substantially arc-shaped rack 39 and between the substantially arc-shaped rack 39 and a base section 42 of the wall. The damping mechanism 35 further comprises a disk 45 having a pivot shaft 47 and a damping protrusion 49. The pivot shaft 47 passes through a through hole 51 formed in the base section of the wall 37 and inserts into a recess 53 formed in a part of the top coil assembly 33 between the opposite walls 37 so that the disk 45 can rotate together with the top coil assembly 33. Meanwhile, the damping protrusion 49 on the disk 45 engages with the substantially arc-shaped rack 39. If necessary, a screw 55 can pass through the pivot shaft 47 and is threaded into the part of the top coil assembly 33 between the opposite walls 37. It should be understood that the connection between the disk 45 and the top coil assembly 33 is not limited to the way as shown in FIG. 8. For example, both the pivot shafts 47 and the damping protrusion 49 are inserted or screwed into the part of the top coil assembly 33 between the opposite walls 37 so that the disks 45 are omitted. Moreover, the damping protrusion 49 can also be formed as an integral part of the top coil assembly 33 that extends from a surface extending radially from the rotation axis OO'.

It should be further understood that all features described above with reference to FIGS. 1-5 are applicable to the damping mechanism 35. All components of the damping mechanism 35 may be made of the plastic materials which is more friendly to the MR non-magnet environment. It is conceived by the skilled in the art that other materials applicable in MRI environment and resilient enough to deform can also be adopted. Further, the damping mechanism according to the present invention may be applicable to other devices, for example, a notebook computer.

Figure 9:
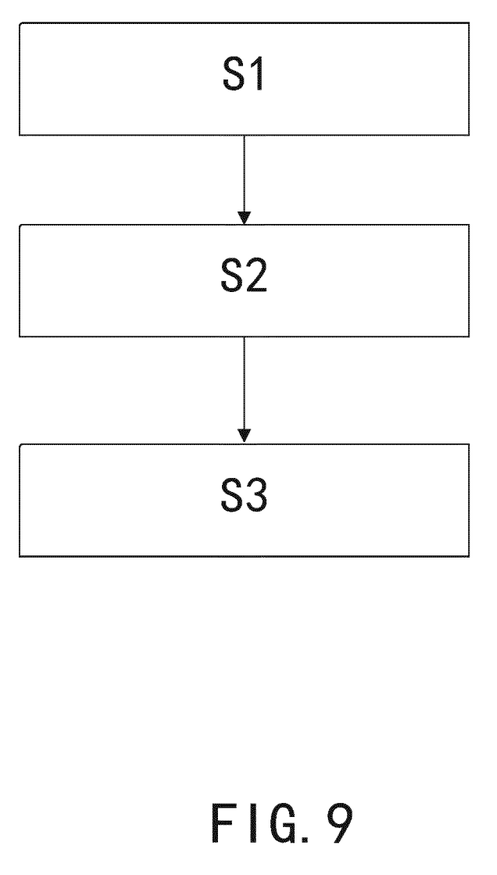
FIG. 9 is a flow chart showing schematically a method for providing a damping to the rotation of a component relative to the other component using a damping mechanism according to the present invention.

FIG. 9 is a flow chart showing schematically a method for a RF coil assembly according to one embodiment of the present invention. As shown in FIG. 9, A top coil assembly rotates relative to a base assembly around a rotation axis OO' in step S1. For example, the top coil assembly 33 rotates relative to the base assembly 31 in FIG. 8. In step S2, a damping protrusion is engaged with an outer surface of a resilient damping section of the base assembly during a rotation movement of the damping protrusion relative to the base assembly. For example, the damping protrusion 49 is engaged with the outer teeth 41 formed on the radial surface of the resilient damping section in the form of an arc-shaped rack 39 that faces away from the rotation axis OO'. The damping protrusion 49 is rigidly connected to the top coil assembly 33 through the disc 45, the shaft 47, the through-hole 51 and the recess 53. Such rigid connection allows the damping protrusion 49 to rotate with the top coil assembly 33. Instead of rigid connection, the damping protrusion 49 can be formed as an integral part of the top coil assembly 33 which extends from the top coil assembly 33 toward the radial surface of the resilient damping section. In step S3, the rotation of the top coil assembly is damped by the engagement between the damping protrusion and the outer surface of the resilient damping section. For example, the engagement between the damping protrusion 49 and outer teeth 41 provides a damping force for the rotation movement.

Although the invention has been described in detail for the purpose of illustration, it is to be understood that such detail is solely for that purpose and that the invention is not limited to the disclosed embodiments.

The invention claimed is:

1. A damping mechanism, for interconnecting parts of a RF coil assembly for magnetic resonance imaging (MRI), the damping mechanism comprising:
   a first member comprising a base section, a resilient damping section and an enclosed chamber defined by the base section and an inner surface of the resilient damping section, wherein the resilient damping section centered about a rotation axis (OO') and the enclosed chamber is provided radially inward of the resilient damping section and configured to accommodate a deformation of the resilient damping section;
   a second member attached pivotably to the base section of the first member to rotate around the rotation axis (OO') relative to the base section; and
   a damping protrusion extending from the second member toward the resilient damping section;
   wherein the resilient damping section comprises an outer surface facing away from the enclosed chamber which is configured to be engaged with the damping protrusion to produce the deformation of the resilient damping section and provide a damping to the rotation of the second member relative to the base section.

2. The damping mechanism according to claim 1, wherein the resilient damping section is configured as a substantially arc-shaped rack having a plurality of outer teeth and the outer surface comprises a toothed surface defined by the plurality of outer teeth.

3. The damping mechanism according to claim 2, wherein a predetermined portion of the resilient damping section is provided with the outer teeth to provide the damping to a predetermined range of rotation of the second member.

4. The damping mechanism according to claim 2, wherein each of the outer teeth comprises a first side surface and a second side surface, and one of the first side surface and the second side surface facing a central portion (C) of the substantially arc-shaped rack is inclined at a larger angle relative to a root surface of the substantially arc-shaped rack than the other of the first side surface and the second side surface facing away from the central portion (C) of the substantially arc-shaped rack.

5. The damping mechanism according to claim 1, wherein the damping mechanism made of plastic material and the resilient damping section is sized to produce the deformation during the rotation.

6. The damping mechanism according to claim 1, wherein the resilient damping section is elastically deformed to move toward the enclosed chamber when the second member rotates relative to the base section.

7. The damping mechanism according to claim 1, wherein the resilient damping section is configured to restore from a deformed state to stop the rotation of the second member relative to the base section.

8. The damping mechanism according to claim 1, further comprising a cover positioned over and spaced apart from the resilient damping section.

9. A RF coil device comprising:
   a base assembly; and
   a top coil assembly which is attached pivotably to the base assembly via a damping mechanism according to claim 1,
   wherein the first member is supported on the base assembly and the second member connected to the top coil assembly.

10. A RF coil device according to claim 9, wherein the damping mechanism is made of plastic material.

11. A MRI apparatus comprising a RF coil device according to claim 9.

12. A method for damping a RF coil assembly, the method comprising:
   rotating a top coil assembly relative to a base assembly around a rotation axis;
   engaging a damping protrusion with an outer surface (15a) of a resilient damping section of the base assembly during a rotation movement of the damping protrusion relative to the base assembly, wherein the outer surface of the resilient damping section is centered about and faces away from the rotation axis (OO'), and the damping protrusion is connected to or an integral part of the top coil assembly for the rotation therewith;
   deforming the resilient damping section to move radially inward as a result of the engagement between the damping protrusion and the resilient damping section during the rotation movement;
   accommodating the deformation of the resilient damping section by an enclosed chamber partially defined by an inner surface of resilient damping section provided inward of the resilient damping section; and
   damping the rotation of the top coil assembly by the deformation of the resilient damping section.

13. The method of claim 12, the resilient damping section substantially in an arc shape centered about the rotation axis (OO').

14. The method of claim 12, further comprising:
   restoring the resilient damping section from a deformed state to stop the top coil assembly at a predetermined position on the outer surface of the resilient damping section.

* * * * *